(12) United States Patent
Batchelor et al.

(10) Patent No.: US 9,569,376 B1
(45) Date of Patent: Feb. 14, 2017

(54) METHOD, SYSTEM, AND COMPUTER PROGRAM PRODUCT FOR MANAGING SHUTDOWN AND SUBSTITUTION OF I/O ENCLOSURES

(71) Applicant: INTERNATIONAL BUSINESS MACHINES CORPORATION, Armonk, NY (US)

(72) Inventors: Gary W. Batchelor, Tucson, AZ (US); Matthew D. Carson, Tucson, AZ (US); Enrique Q. Garcia, Tucson, AZ (US); Larry Juarez, Tucson, AZ (US); Jay T. Kirch, Tucson, AZ (US); Brian A. Rinaldi, Tucson, AZ (US); Todd C. Sorenson, Tucson, AZ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/947,864

(22) Filed: Nov. 20, 2015

(51) Int. Cl.
*G06F 13/12* (2006.01)
*G01R 31/08* (2006.01)
*G06F 13/10* (2006.01)
*G06F 9/44* (2006.01)

(52) U.S. Cl.
CPC ............ *G06F 13/102* (2013.01); *G06F 9/442* (2013.01); *G01R 31/08* (2013.01)

(58) Field of Classification Search
CPC ........................ G06F 11/0709; G06F 13/4068
USPC .......................................................... 710/74
See application file for complete search history.

(56) References Cited

U.S. PATENT DOCUMENTS

| | | | |
|---|---|---|---|
| 4,970,640 A | 11/1990 | Beardsley et al. | |
| 5,295,258 A | 3/1994 | Jewett et al. | |
| 5,668,532 A * | 9/1997 | Beer | G11B 33/144 326/10 |
| 6,792,550 B2 * | 9/2004 | Osecky | G06F 1/206 361/695 |
| 7,457,248 B1 * | 11/2008 | Ali | H04L 43/0811 370/235 |
| 7,822,959 B2 * | 10/2010 | Cors | G06F 9/442 713/1 |
| 8,390,464 B1 | 3/2013 | Slifkin et al. | |
| 8,954,808 B1 | 2/2015 | McLean et al. | |
| 2008/0270644 A1 | 10/2008 | Rooney et al. | |

(Continued)

FOREIGN PATENT DOCUMENTS

EP 2083345 7/2009

OTHER PUBLICATIONS

Office Action dated Apr. 25, 2016, pp. 15, for U.S. Appl. No. 14/947,854, filed Nov. 20, 2015.

(Continued)

*Primary Examiner* — Titus Wong
(74) *Attorney, Agent, or Firm* — Rabindranath Dutta; Konrad Raynes Davda & Victor LLP

(57) ABSTRACT

A storage controller determines a presence of an indication from an Input/Output (I/O) enclosure that the I/O enclosure will perform a shutdown after a predetermined amount of time. The storage controller determines whether the I/O enclosure provides a last path to data stored in a storage device. A request is transmitted to the I/O enclosure to perform either an orderly shutdown or abort the shutdown, based on the whether the I/O enclosure provides the last path to the data stored in the storage device.

20 Claims, 9 Drawing Sheets

(56) References Cited

U.S. PATENT DOCUMENTS

| | | |
|---|---|---|
| 2014/0053017 A1 | 2/2014 | Bartlett et al. |
| 2014/0111932 A1* | 4/2014 | Fukuda ................ G11B 33/128 361/679.33 |
| 2014/0189088 A1* | 7/2014 | Grimes .................... G06F 9/00 709/223 |
| 2015/0193289 A1 | 7/2015 | Andre et al. |
| 2015/0263518 A1 | 9/2015 | Liu |
| 2015/0347251 A1 | 12/2015 | He et al. |

OTHER PUBLICATIONS

List of IBM Patents or Patent Applications Treated as Related, dated Nov. 20, 2015, pp. 2.

U.S. Appl. No. 14/947,854, filed Nov. 20, 2015.

"About preventing data corruption with I/O fencing About I/O fencing in SF Sybase CE environment", Symantec, received on Oct. 29, 2015, pp. 5.

Response dated Jul. 23, 2016, pp. 9, to Office Action dated Apr. 25, 2016, pp. 15, for U.S. Appl. No. 14/947,854, filed Nov. 20, 2015.

Office Action dated Sep. 14, 2016, pp. 14, for U.S. Appl. No. 14/947,854, filed Nov. 20, 2015.

* cited by examiner

METHOD, SYSTEM, AND COMPUTER PROGRAM PRODUCT FOR MANAGING SHUTDOWN AND SUBSTITUTION OF I/O ENCLOSURES

BACKGROUND

1. Field

Embodiments relate to a method, system, and computer program product for managing shutdown and substitution of I/O enclosures.

2. Background

In certain storage system environments, a storage controller (or a storage controller complex) may comprise a plurality of storage servers that are coupled to each other, where one or more of the storage servers may comprise a plurality of processing nodes or servers. The storage controller allows host computing systems to perform input/output (I/O) operations with storage devices controlled by the storage controller.

An I/O enclosure that includes I/O adapters may be used to provide a communication path among the storage controller, the storage devices, and the host computing systems. In certain situations, a plurality of I/O enclosures may be maintained to provide redundancy in the storage system environment.

In many situations the storage system environment may have hardware or software problems that may need to be resolved. Various mechanisms are available for recovery to help resolve software and hardware problems. Such recovery mechanisms may include suspension of I/O, software threads, software components, etc., in the storage system.

SUMMARY OF THE PREFERRED EMBODIMENTS

Provided are a method, a system, and a computer program product in which a storage controller determines a presence of an indication from an Input/Output (I/O) enclosure that the I/O enclosure will perform a shutdown after a predetermined amount of time. The storage controller determines whether the I/O enclosure provides a last path to data stored in a storage device. A request is transmitted to the I/O enclosure to perform either an orderly shutdown or abort the shutdown, based on the whether the I/O enclosure provides the last path to the data stored in the storage device.

In certain embodiments, in response to determining that the I/O enclosure provides the last path to data stored in the storage device, the storage controller transmits a request to the I/O enclosure to abort the shutdown of the I/O enclosure.

In additional embodiments, in response to the I/O enclosure receiving the request to abort the shutdown of the I/O enclosure, the I/O enclosure continues to operate even when one or more fans of the I/O are non-operational or a communication path to the one or more fans is lost.

In yet additional embodiments, the transmitting of the request to the I/O enclosure to abort the shutdown of the I/O enclosure is relayed by a rack power controller from the storage controller to the I/O enclosure.

In further embodiments, in response to determining that the I/O enclosure does not provide the last path to data stored in the storage device, the storage controller performs: quiescing all I/O adapters of the I/O enclosure; quiescing the I/O enclosure, in response to completion of quiescing of all of the I/O adapters of the I/O enclosure; fencing the I/O enclosure and resources of all the I/O adapters, in response to completion of the quiescing of the I/O enclosure; sending the I/O enclosure to an offline state by powering off the I/O enclosure, in response to quiescing the I/O enclosure; and requesting another I/O enclosure to take over functions of the I/O enclosure in response to the I/O enclosure entering the offline state.

In certain embodiments, the I/O enclosure is a first I/O enclosure, wherein a second I/O enclosure is configurable to substitute the first I/O enclosure, and wherein the second I/O enclosure may or may not be operational.

In yet additional embodiments, if the I/O enclosure provides the last path to the data stored in the storage controller then in response to the shutdown of the I/O enclosure, a host is unable to access the data, wherein if the I/O enclosure does not provide the last path to the data stored in the storage controller then in response to the shutdown of the I/O enclosure, the host is able to access the data via another I/O enclosure.

BRIEF DESCRIPTION OF THE DRAWINGS

Referring now to the drawings in which like reference numbers represent corresponding parts throughout.

DETAILED DESCRIPTION

In the following description, reference is made to the accompanying drawings which form a part hereof and which illustrate several embodiments. It is understood that other embodiments may be utilized and structural and operational changes may be made.

In enterprise storage systems, I/O enclosures are the bays that contain adapters, where the adapters provide paths for I/O to the storage devices for retrieving or accessing data.

Due to the close confinement of the adapters within these bays, a significant amount of heat may be generated in a small amount of space. The adapters inside the bays and the bays themselves may be kept cool by two identical, yet physically separate fans. However, these fans may fail, causing the bays to reach dangerous levels of heat that may damage the enclosed hardware.

The bays are responsible for detecting when their fans have undergone a situation where the fans may not operate properly. In certain situations, the detection may be via tachometer readings on the fans. In certain other situations, the bays may no longer be able to determine whether the fans are running (e.g., in a situation where the bus line that the bays use to receive data from the fans is locked up). When either of the above situations are encountered, the bay may shut itself down immediately. By doing so, the storage system reduces the risk of damaging hardware, but pays the price of potentially losing the last path to data. Certain embodiments provide mechanisms to balance the risk of damaging hardware with the risk of losing the last path to the data.

In certain storage system solutions, the fans are not monitored by the storage controller. This means that the storage controller may not communicate the information regarding the last path to data to the bays. So whenever a bay reaches a point of being too hot or when the bay is unable to infer whether the fans are running, the bay may immediately perform a shutdown and leave the customer in a potential situation of loss of access to data.

Certain embodiments allow the storage controller to establish a new form of communication with the bay's firmware. In certain embodiments, the bay may start a one minute timer and then notify the storage controller of its intent to shut itself off. For any bay that is not the last path to data, the storage system may shut the bay off via a quiesce (i.e., stoppage or suspension) and fence (i.e., isolation) to reduce the impact of interruption to the customer. For any bay that the storage controller deems is the last path to a particular set of data, the storage controller may send a message to the bay instructing the bay to halt its own shutdown. By doing so, the storage controller maintains the path needed for the adapters of the bay to continue their I/O.

Exemplary Embodiments

Figure 1:
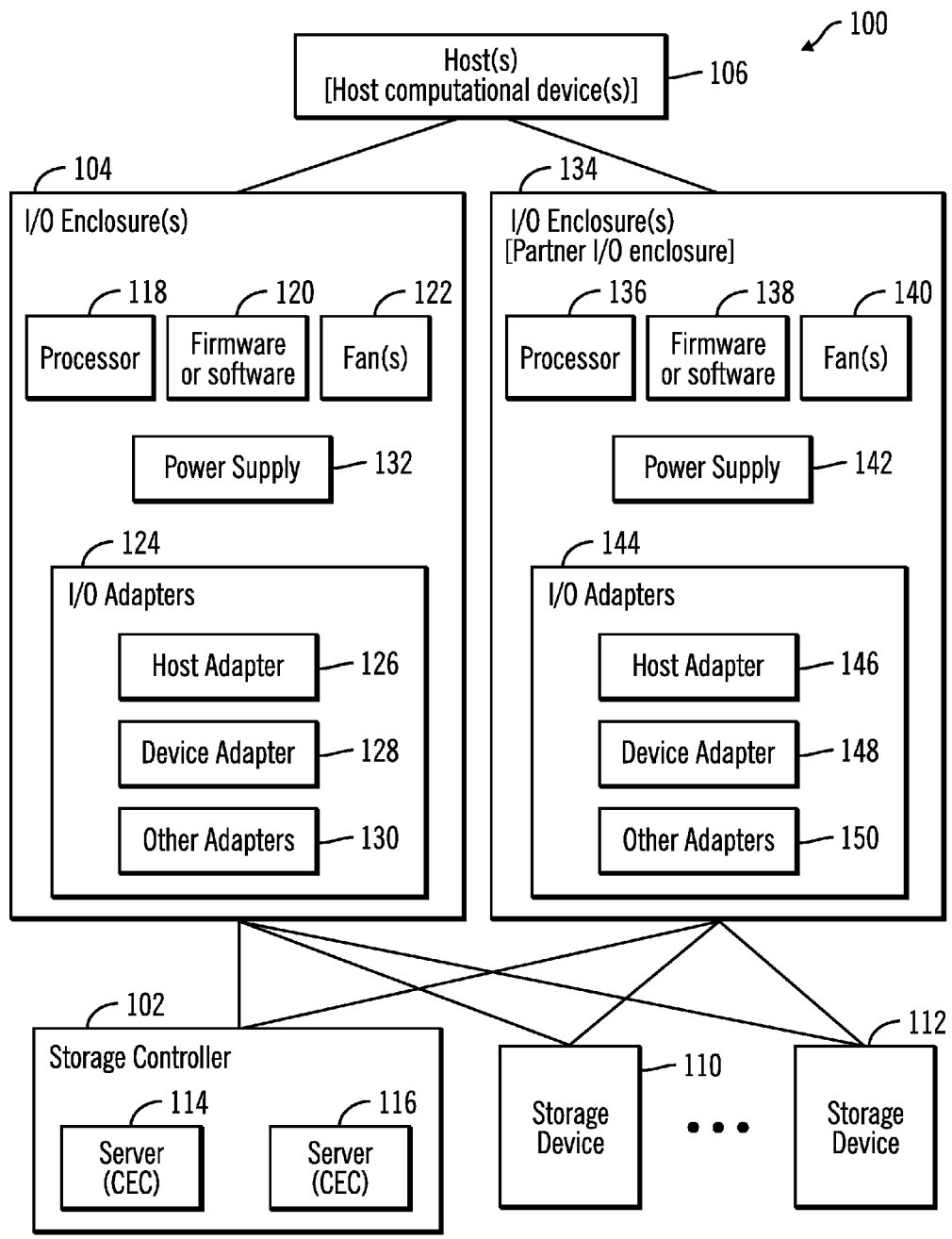
FIG. 1 illustrates a block diagram of a computing environment comprising a storage controller, two I/O enclosures, and one or more host computational devices, where the storage controller allows host computational devices to perform input/output (I/O) operations with storage devices controlled by the storage controller, in accordance with certain embodiments.

FIG. 1 illustrates a block diagram of a computing environment 100 comprising a storage controller 102, I/O enclosures 104, 134 and one or more host computational devices 106, where the storage controller 102 allows the host computational devices 106 to perform input/output (I/O) operations with one or more storage devices 110, 112 controlled by the storage controller 102, in accordance with certain embodiments. The I/O enclosures 104, 134 provides a pathway for communications among the hosts 106, the storage controller 102, and the storage devices 110, 112. While two I/O enclosures 104, 134 are shown in FIG. 1, in certain embodiments there may be a greater number of I/O enclosures to provide redundancy in case of a failure of one or more of the I/O enclosures.

The storage controller 102 comprises a plurality of server computational devices 114, 116. The server computational devices 114, 116 may also be referred to as servers or central electronic complexes (CEC) or processor complexes. The storage controller 102 may comprise a set of hardware that includes central processing units (CPU), memory, channels, controllers, etc.

The servers 114, 116 of the storage controller 102, the storage controller 102, and the hosts 106 may comprise any suitable computational device including those presently known in the art, such as, a personal computer, a workstation, a server, a mainframe, a hand held computer, a palm top computer, a telephony device, a network appliance, a blade computer, a processing device, etc. The servers 114, 116, the storage controller 102, and the hosts 106 may be elements in any suitable network, such as, a storage area network, a wide area network, the Internet, an intranet. In certain embodiments, the servers 114, 116 may function redundantly and one server may be able to take over the operations of the other server. In certain embodiments, the servers 114, 116 of the storage controller 102, the storage controller 102, the hosts 106, the I/O enclosures 104, 134, and the storage devices 110, 112 may be elements in a cloud computing environment.

The I/O enclosure 104 may include a processor 118, firmware or software 120, one or more fans 122, and one or more I/O adapters 124. The firmware or software 120 may in cooperation with the processor 118 execute operations in the I/O enclosure 104. The fan 122 may be used for cooling the I/O enclosure and in case the fan 122 stops functioning properly the I/O enclosure 104 may overheat after a certain amount of time and damage may be caused to components of the I/O enclosure 104. A power supply 132 may be included to supply power to the I/O enclosure 104. The I/O adapters 124 may include one or more host adapters 126 that connect to hosts 106, one or more device adapters 128 that connect to the storage devices 110, 112 and other adapters 130.

Similar to I/O enclosure 104, the I/O enclosure 134 may include a processor 136, firmware or software 138, one or more fans 140, a power supply 142, and I/O adapters 144 including one or more host adapters 146, one or more device adapters 148, and other adapters 150. In certain embodiments, the I/O enclosure 134 may be referred to as a partner I/O enclosure of the I/O enclosure 104, as I/O enclosure 134 may be used instead of the I/O enclosure 104. Similarly, I/O enclosure 104 may act as a partner I/O enclosure of I/O enclosure 134.

In certain embodiments, if the I/O enclosure 104 does not provide a last path to a set of data, then in the event of a critical cooling error in the I/O enclosure 104, the storage controller 102 first gracefully quiesces the I/O adapters 124, then quiesces the I/O enclosure 104, and then fences the I/O enclosure 104 and the resources of the I/O adapters 124. Once the I/O enclosure 104 and the resources of the I/O adapters 124 are fenced, the storage controller 102 sends the I/O enclosure 104 to an offline state by requesting the I/O enclosure 104 to power off by switching off power via the power supply 132. A partner I/O enclosure 134 then substitutes the I/O enclosure 104.

If the I/O enclosure 104 provides a last path to a set of data then the I/O enclosure 104 is not allowed to perform a shutdown (also referred to as power shutdown) and the risk of overheating of the I/O enclosure 104 is taken.

Figure 2:
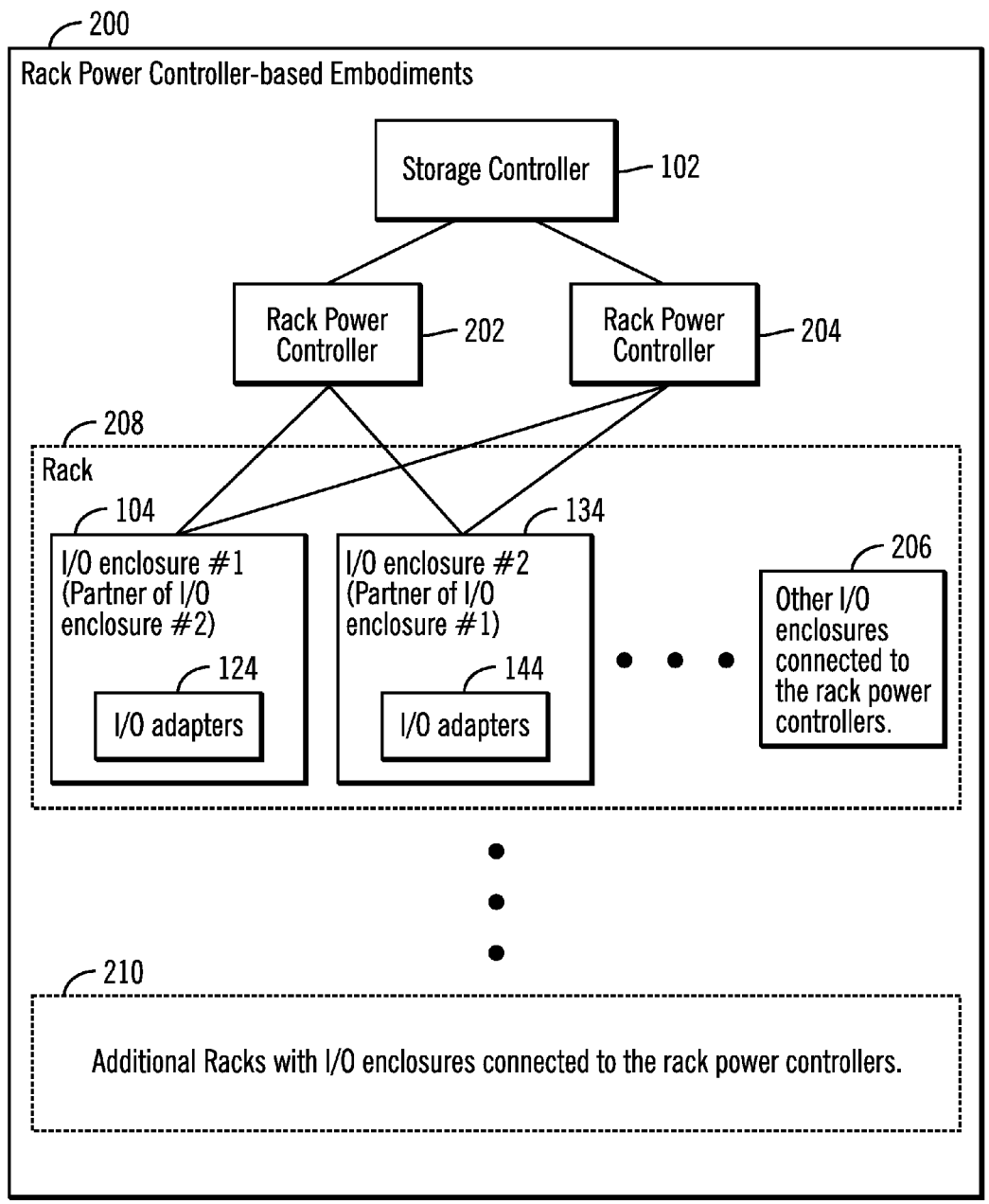
FIG. 2 illustrates a block diagram that shows a plurality of rack power controllers with communication paths to the storage controller and I/O enclosures maintained in racks, in accordance with certain embodiments.

FIG. 2 illustrates a block diagram 200 that shows a plurality of rack power controllers 202, 204 with communication paths to the storage controller 102 and I/O enclosures 104, 134, 206 maintained in racks 208, 210, in accordance with certain embodiments. Each of the racks 208, 210 may have a plurality of I/O enclosures. For example, in FIG. 2, rack 208 is shown to have I/O enclosures 104, 134, 206, where I/O enclosure 104 and I/O enclosure 134 are partners, i.e., I/O enclosure 104 may substitute I/O enclosure 134 and vice versa without loss of data.

The two rack power controllers 202, 204 provide redundancy so that even if one of the two rack power controllers 202, 204 fail, the other rack power controller is able to provide a path between the storage controller 102 and the I/O enclosures 104, 134, 206 contained in the racks 208, 210.

Figure 3:
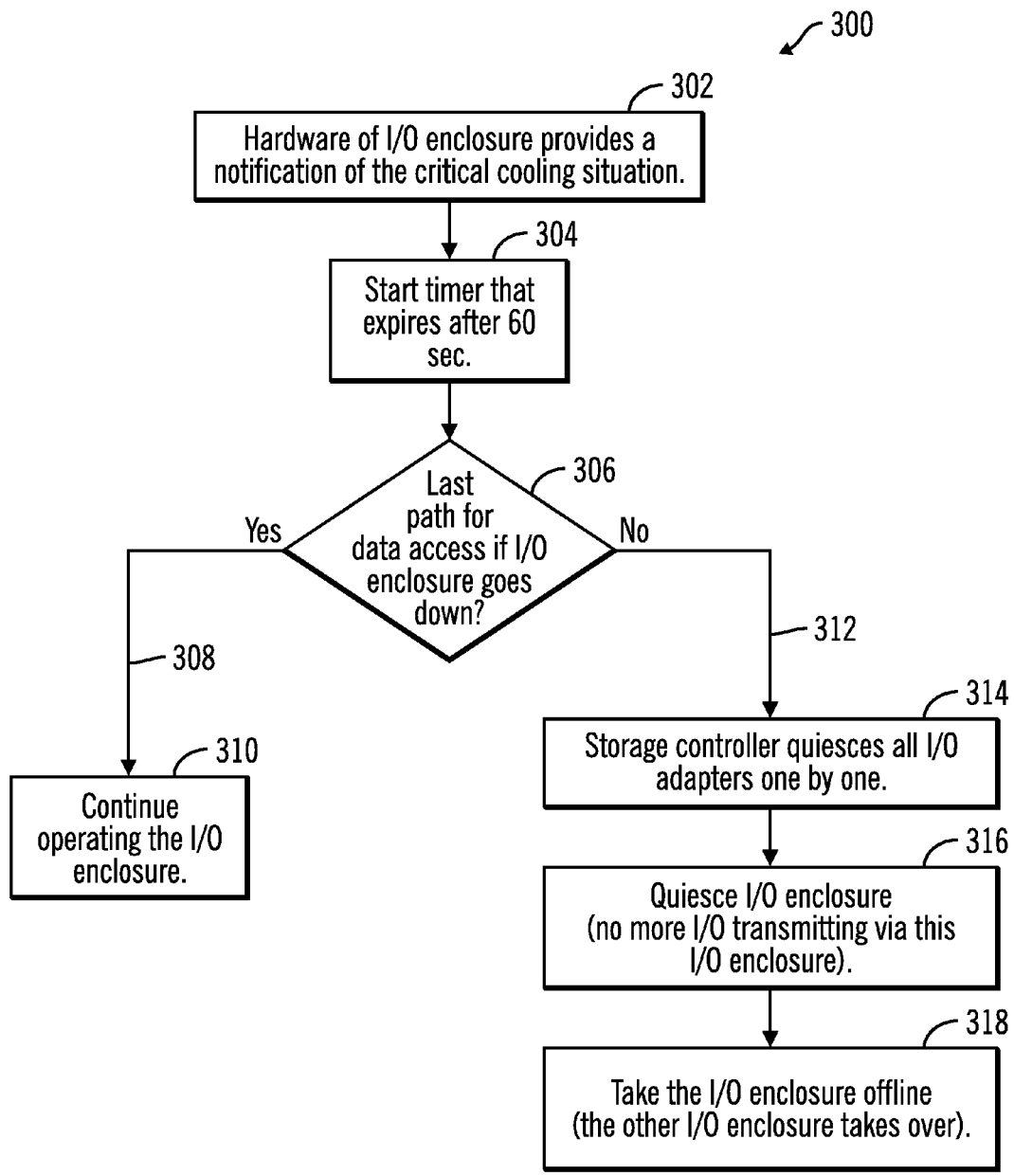
FIG. 3 illustrates a flowchart that shows how to determine whether to perform a shutdown of an I/O enclosure, in accordance with certain embodiments.

FIG. 3 illustrates a flowchart 300 that shows how to determine whether to perform a shutdown of the I/O enclosure 104, in accordance with certain embodiments.

Control starts at block 302 in which hardware of the I/O enclosure 104 provides a notification of a critical cooling situation caused by a malfunction of the one or more fans 122 or by an inability to determine the status of the one or more fans 122. A timer with a predetermined duration for expiry (e.g., 60 seconds) is started (at block 304).

Control proceeds to block 306 in which the storage controller 102 determines whether the I/O enclosure 104 provides a last path for data access if the I/O enclosure 104 goes down. For example, the last path for data access is provided by the I/O enclosure 104 if partner I/O enclosure 134 is in a powered off state.

If the I/O enclosure 104 provides the last path for data access (branch 308 from block 306) then control proceeds to block 310 and the storage controller 102 sends commands for continuing to operate the I/O enclosure 104. As a result, no data access loss occurs but there is some risk that the I/O enclosure components may overheat and destroy the I/O enclosure 104.

If the I/O enclosure 104 does not provide the last path for data access (branch 312 from block 306) then control proceeds to block 314. Since the last path for data access is not provided by I/O enclosure 104, the partner I/O enclosure 134 is up and running. In block 314, the storage controller 102 quiesces (i.e. stops or suspends) all I/O adapters 124 one by one, and then quiesces (at block 316) the I/O enclosure 104 such that no more I/O transmissions occur via the I/O enclosure 104. Then the I/O enclosure 104 is fenced (i.e., isolated) and taken offline (at block 318). The other I/O enclosure 134 then takes over the operations of the I/O enclosure 104.

Therefore, in FIG. 3, if the last path for data access is not via the I/O enclosure 104 then the I/O enclosure 104 is shut down gracefully and the operations of the I/O enclosure 104 are handled by the partner I/O enclosure 132. Otherwise, the I/O enclosure 104 continues to process I/O while under the risk of overheating. Even if the timer expires (i.e., 60 seconds are over), the I/O enclosure 104 is not shut down in the situation where the I/O enclosure 104 is the last path for data access.

Figure 4:
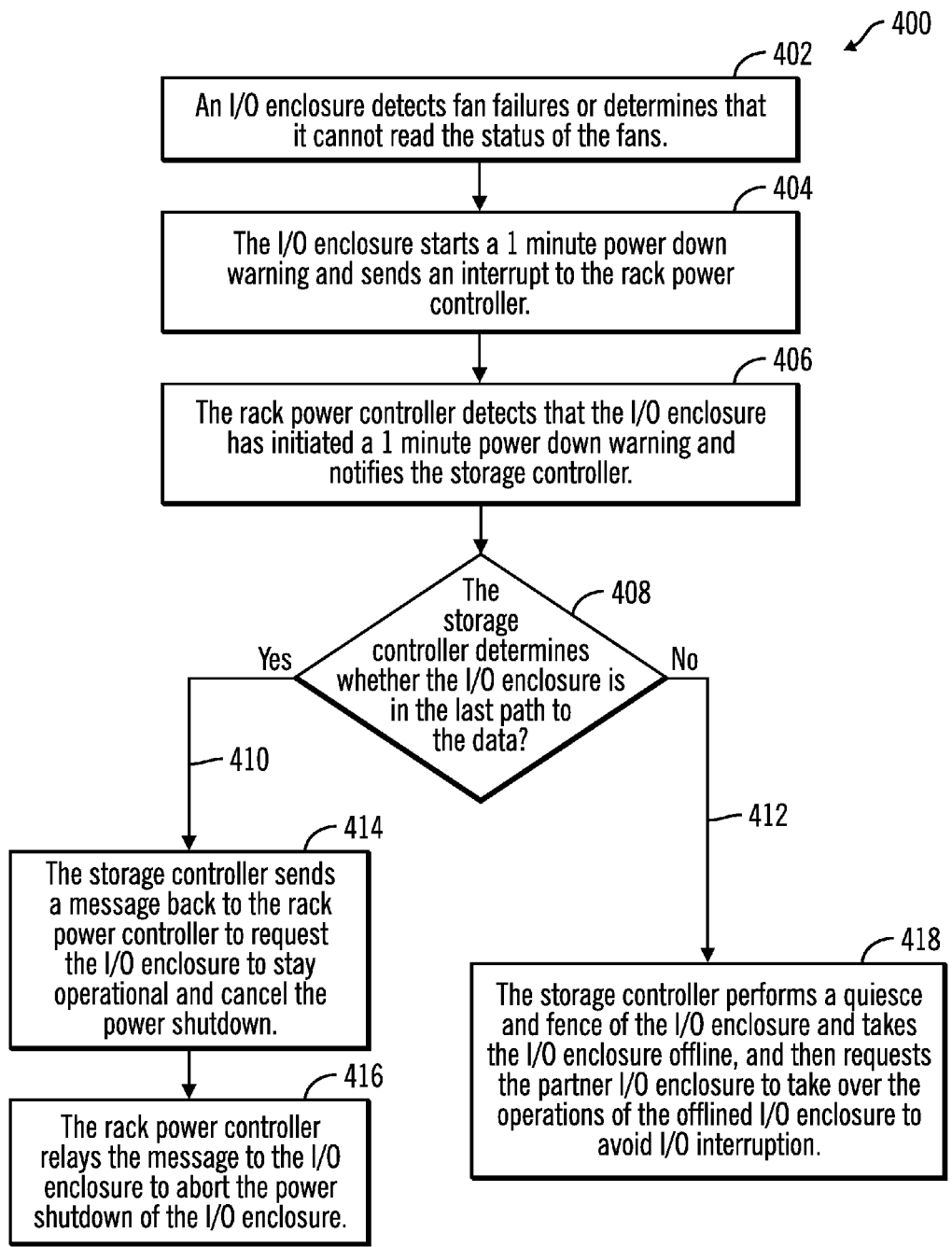
FIG. 4 illustrates another flowchart that shows how to determine whether to perform a shutdown of the I/O enclosure, in accordance with certain embodiments.

FIG. 4 illustrates another flowchart 400 that shows how to determine whether to perform a shutdown of the I/O enclosure 104, in accordance with certain embodiments.

Control starts at block 402 in which an I/O enclosure 104 detects fan failures or determines that it cannot read the status of the fans 122. The I/O enclosure 104 starts (at block 404) a 1 minute power down warning and send an interrupt to the rack power controller 202. The 1 minute power down warning indicates that the I/O enclosure 104 will be shut down after the expiry of 1 minute, unless the storage controller 102 performs some other operations (e.g., generate a request for a graceful shutdown of the I/O enclosure 104, or generate a request to continue operating the I/O enclosure 104 at the risk of overheating) on the I/O enclosure 104.

The rack power controller 202 detects that the I/O enclosure 104 has initiated a 1 minute power down warning and notifies the storage controller 102. The storage controller 102 determines (at block 408) whether the I/O enclosure 104 is in the last path to the data.

If the I/O enclosure 104 is in the last path to the data ("Yes" branch 410 from block 408) control proceeds to block 414 in which the storage controller 102 sends a message back to the rack power controller 202 to request the I/O enclosure 104 to stay operational and cancel the power shutdown. The rack power controller 202 relays (at block 416) the message to the I/O enclosure 104 to abort the power shutdown of the I/O enclosure 104.

If the I/O enclosure 104 is not in the last path to the data ("No" branch 412 from block 408) control proceeds to block 418 in which the storage controller 102 performs a quiesce and fence of the I/O enclosure 104 and takes the I/O enclosure 104 offline, and then requests the partner I/O enclosure 134 to take over the operations of the I/O enclosure 104 (which is being shut down and is offline) to avoid I/O interruption. The hosts 106 continue to perform I/O by using the partner I/O enclosure 134 to communicate directly or indirectly with the storage controller 102 that controls the storage devices 110, 112.

Figure 5:
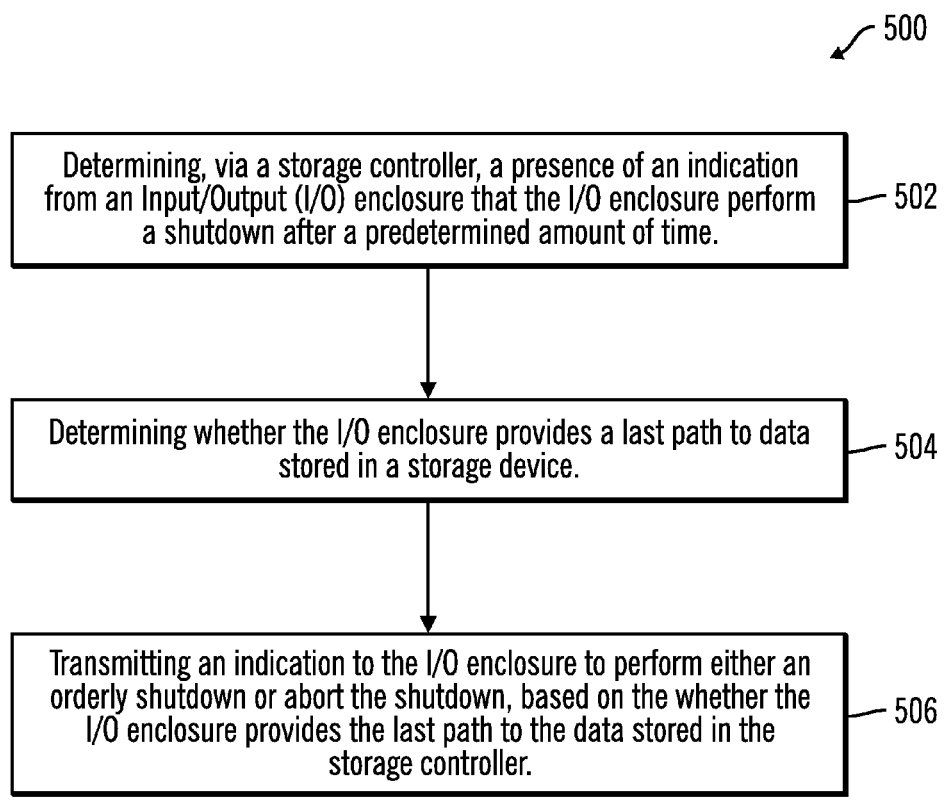
FIG. 5 illustrates a flowchart that shows operations performed by a storage controller in communication with one or more I/O enclosures, in accordance with certain embodiments.

FIG. 5 illustrates a flowchart 500 that shows operations performed by a storage controller 102 in communication with one or more I/O enclosures 104, 134, in accordance with certain embodiments.

Control starts at block 502 in which a storage controller 102 determines a presence of an indication from an Input/Output (I/O) enclosure 104 that the I/O enclosure 104 will perform a shutdown after a predetermined amount of time. The storage controller 102 determines (at block 504) whether the I/O enclosure 104 provides a last path to data stored in a storage device. A request is transmitted (at block 506) to the I/O enclosure 104 to perform either an orderly shutdown or abort the shutdown, based on the whether the I/O enclosure 104 provides the last path to the data stored in the storage device.

Figure 6:
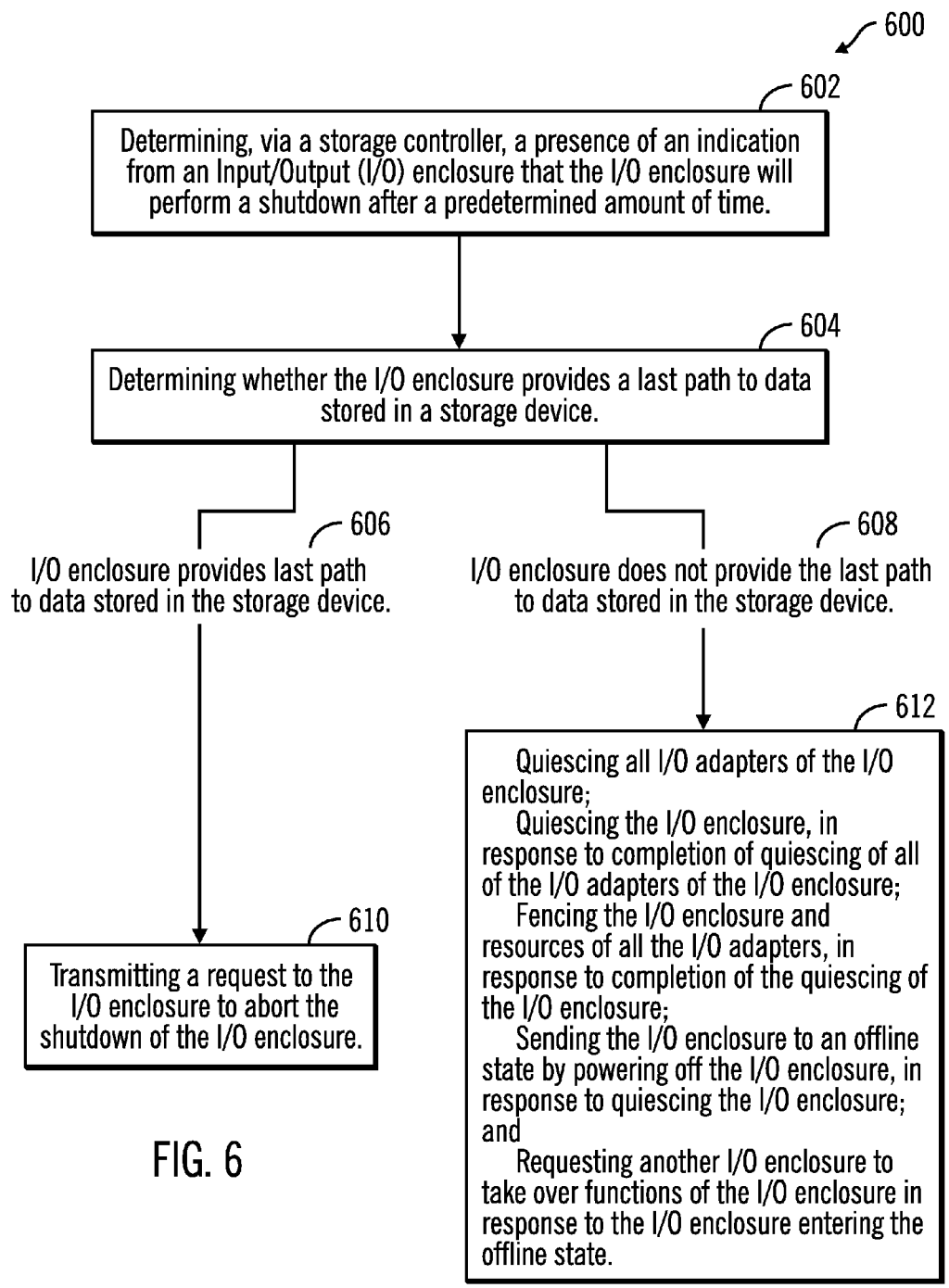
FIG. 6 illustrates another flowchart that shows operations performed by a storage controller in communication with one or more I/O enclosures, in accordance with certain embodiments.

FIG. 6 illustrates a flowchart 600 that shows operations performed by a storage controller 102 in communication with one or more I/O enclosures 104, 134, in accordance with certain embodiments.

Control starts at block 602 in which a storage controller 102 determines a presence of an indication from an Input/Output (I/O) enclosure 104 that the I/O enclosure 104 will perform a shutdown after a predetermined amount of time. The storage controller 102 determines (at block 604) whether the I/O enclosure 104 provides a last path to data stored in a storage device.

If the storage controller 102 determines that the I/O enclosure provides a last path to the data stored in the storage device (branch 606 from block 604), then a request is transmitted (at block 610) from the storage controller 102 to the I/O enclosure 104 to abort the shutdown of the I/O enclosure 104.

If the storage controller 102 determines that the I/O enclosure 104 does not provide a last path to the data stored in the storage device (branch 608 from block 604), then control proceeds to block 612. At block 612, all I/O adapters 124 of the I/O enclosure are quiesced by the storage controller 102. The storage controller 102 performs a quiescing of the I/O enclosure 104, in response to completion of quiescing of all of the I/O adapters of the I/O enclosure. The I/O enclosure 104 and resources of all the I/O adapters are fenced, in response to completion of the quiescing of the I/O enclosure. The I/O enclosure 104 is sent to an offline state by powering off the I/O enclosure 104 (i.e., a power shutdown occurs for the I/O enclosure 104), in response to quiescing the I/O enclosure 104. The storage controller 102 then requests another I/O enclosure 134 to take over the functions of the I/O enclosure 104, in response to the I/O enclosure 104 entering the offline state.

Therefore, FIGS. 1-6 illustrate certain embodiments for continuing to operate an I/O enclosure with the risk of overheating when failure of the I/O enclosure may lead to data access loss because no partner I/O enclosure is available to take over the functions of the I/O enclosure that has the risk of overheating. In case a partner I/O enclosure is available, then the I/O enclosure with the risk of overheating is shut down in an orderly manner by quiescing and fencing the I/O adapters of the I/O enclosure and the I/O enclosure. The hosts continue to perform I/O and do not have to be notified either of the likelihood of overheating of the I/O enclosure or of the substitution of the I/O enclosure by the partner I/O enclosure 134.

Cloud Computing Environment

Cloud computing is a model for enabling convenient, on-demand network access to a shared pool of configurable computing resources (e.g., networks, servers, storage, applications, and services) that can be rapidly provisioned and released with minimal management effort or service provider interaction.

Figure 7:
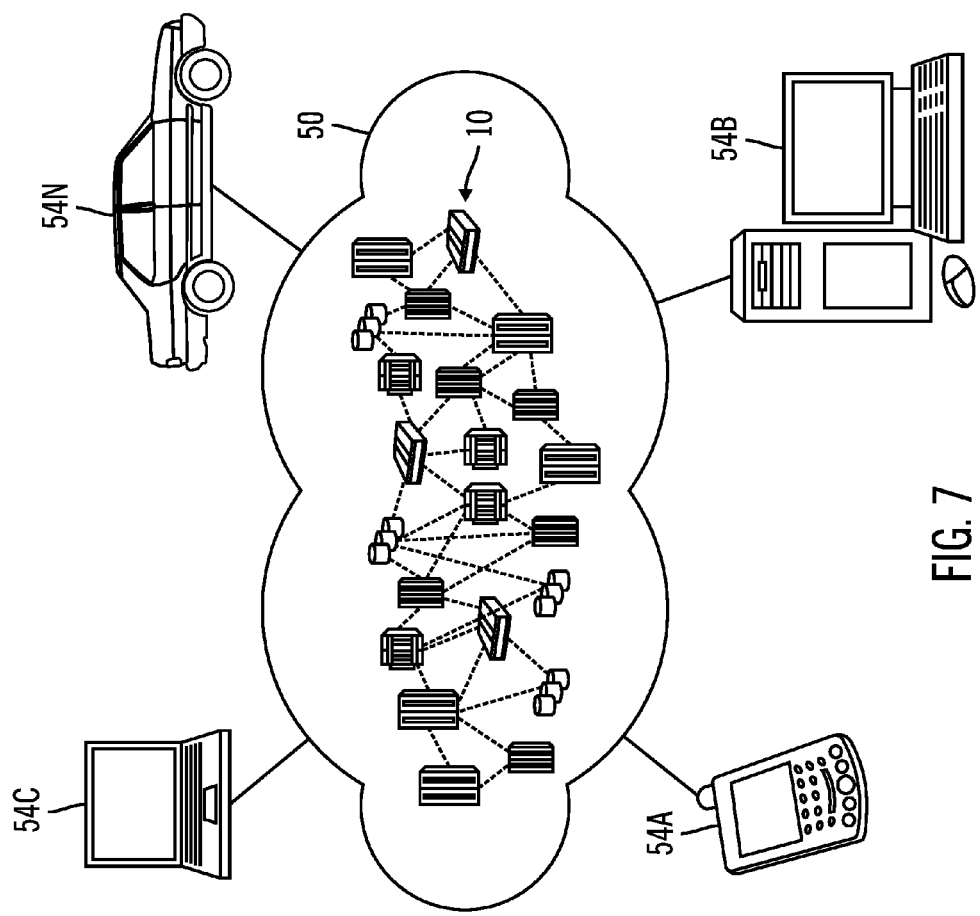
FIG. 7 illustrates a block diagram of a cloud computing environment, in accordance with certain embodiments.

Referring now to FIG. 7, an illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 7 are intended to be illustrative only and that computing nodes 10 and cloud computing environment 50 can communicate with any type of computerized device over any type of network and/or network addressable connection (e.g., using a web browser).

Figure 8:
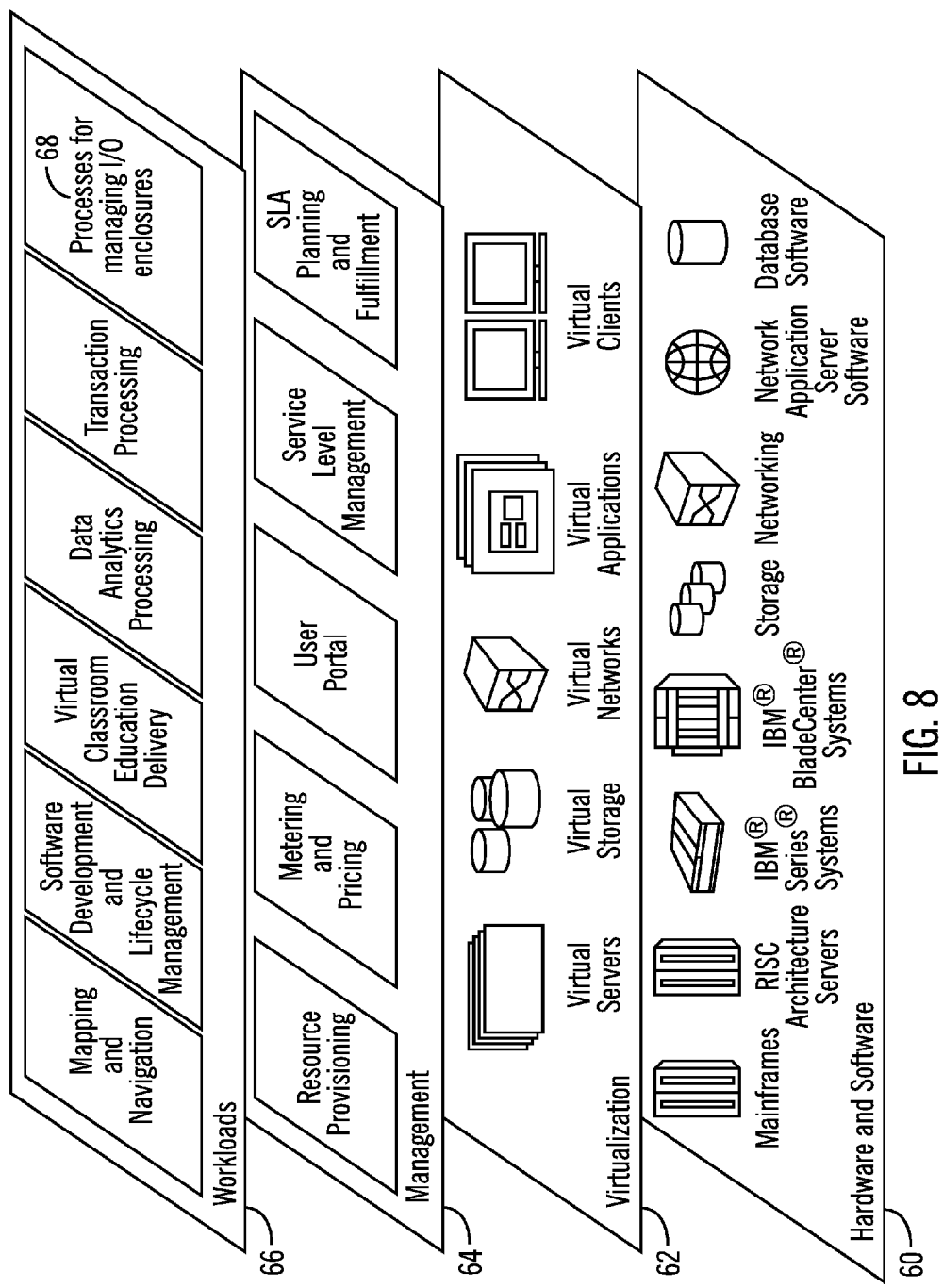
FIG. 8 illustrates a block diagram of further details of the cloud computing environment of FIG. 7, in accordance with certain embodiments.

Referring now to FIG. 8, a set of functional abstraction layers provided by cloud computing environment 50 (FIG. 7) is shown. It should be understood in advance that the components, layers, and functions shown in FIG. 8 are intended to be illustrative only and embodiments of the invention are not limited thereto.

Hardware and software layer 60 includes hardware and software components. Examples of hardware components include mainframes, in one example IBM zSeries* systems; RISC (Reduced Instruction Set Computer) architecture based servers, in one example IBM pSeries* systems; IBM xSeries* systems; IBM BladeCenter* systems; storage devices; networks and networking components. Examples of software components include network application server software, in one example IBM WebSphere* application server software; and database software, in one example IBM DB2* database software.

* IBM, zSeries, pSeries, xSeries, BladeCenter, WebSphere, and DB2 are trademarks of International Business Machines Corporation registered in many jurisdictions worldwide.

Virtualization layer 62 provides an abstraction layer from which the following examples of virtual entities may be provided: virtual servers; virtual storage; virtual networks, including virtual private networks; virtual applications and operating systems; and virtual clients.

In one example, management layer 64 may provide the functions described below. Resource provisioning provides dynamic procurement of computing resources and other resources that are utilized to perform tasks within the cloud computing environment. Metering and Pricing provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal provides access to the cloud computing environment for consumers and system administrators. Service level management provides cloud computing resource allocation and management such that required service levels are met. Service Level Agreement (SLA) planning and fulfillment provide pre-arrangement for, and procurement of, cloud computing resources for which a future requirement is anticipated in accordance with an SLA.

Workloads layer 66 provides examples of functionality for which the cloud computing environment may be utilized. Examples of workloads and functions which may be provided from this layer include: mapping and navigation; software development and lifecycle management; virtual classroom education delivery; data analytics processing; transaction processing; and the processes for managing I/O enclosures 68 as shown in FIGS. 1-8.

Additional Embodiment Details

The described operations may be implemented as a method, apparatus or computer program product using standard programming and/or engineering techniques to produce software, firmware, hardware, or any combination thereof. Accordingly, aspects of the embodiments may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the embodiments may take the form of a computer program product. The computer program product may include a computer readable storage medium (or media) having computer readable program instructions thereon for causing a processor to carry out aspects of the present embodiments.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present embodiments may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present embodiments.

Aspects of the present embodiments are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instruction.

Figure 9:
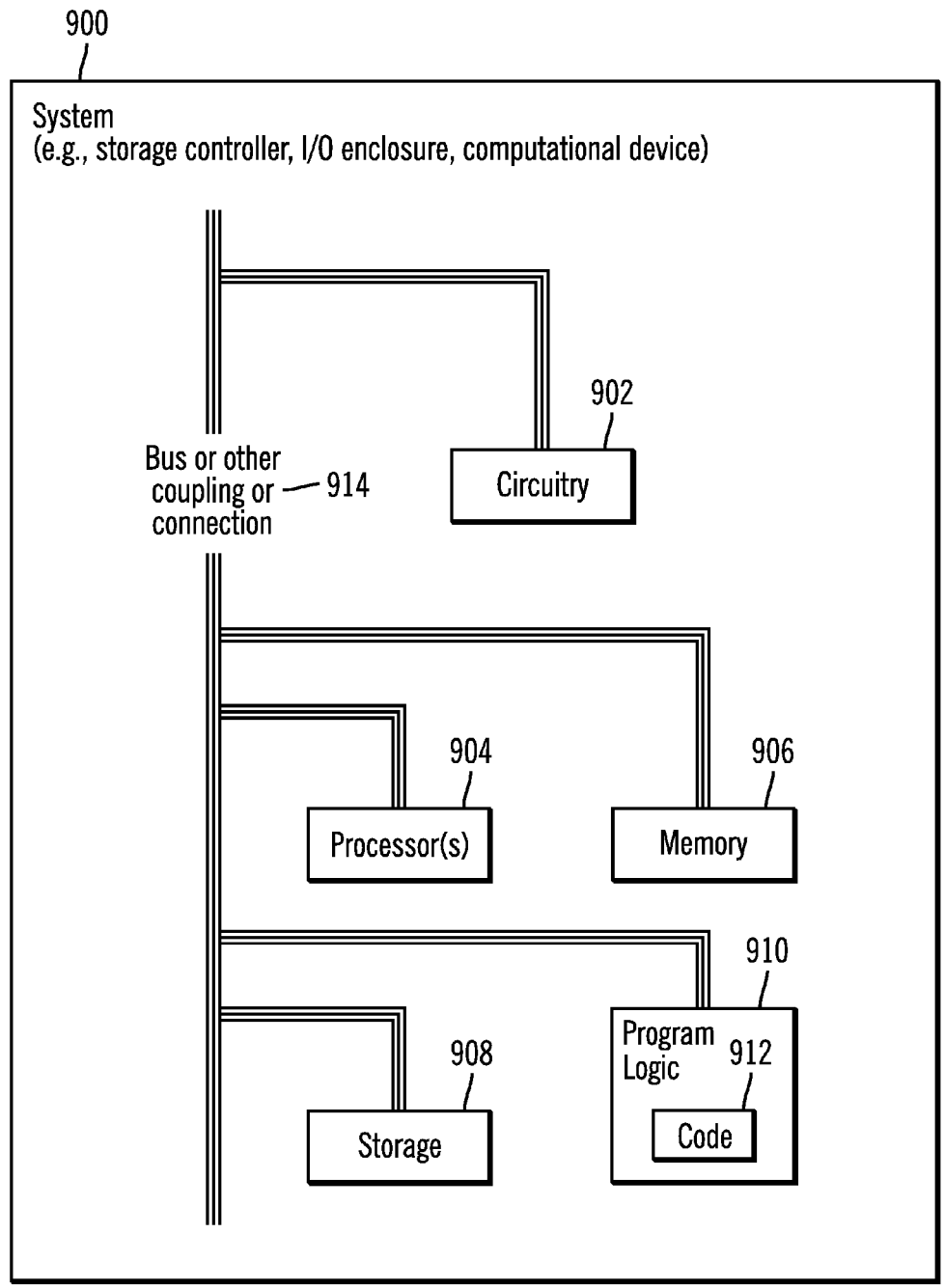
FIG. 9 illustrates a block diagram of a computational system that shows certain elements that may be included in the storage controller including servers shown in FIG. 1, in accordance with certain embodiments.

FIG. 9 illustrates a block diagram that shows certain elements that may be included in the storage controller 102, the servers 114, 116, the hosts 106, the I/O enclosure 104, 134 or other computational devices in accordance with certain embodiments. The system 900 may include a circuitry 902 that may in certain embodiments include at least a processor 904. The system 900 may also include a memory 906 (e.g., a volatile memory device), and storage 908. The storage 908 may include a non-volatile memory device (e.g., EEPROM, ROM, PROM, flash, firmware, programmable logic, etc.), magnetic disk drive, optical disk drive, tape drive, etc. The storage 908 may comprise an internal storage device, an attached storage device and/or a network accessible storage device. The system 900 may include a program logic 910 including code 912 that may be loaded into the memory 906 and executed by the processor 904 or circuitry 902. In certain embodiments, the program logic 910 including code 912 may be stored in the storage 908. In certain other embodiments, the program logic 910 may be implemented in the circuitry 902. One or more of the components in the system 900 may communicate via a bus or via other coupling or connection 914. Therefore, while FIG. 9 shows the program logic 910 separately from the other elements, the program logic 910 may be implemented in the memory 906 and/or the circuitry 902.

Certain embodiments may be directed to a method for deploying computing instruction by a person or automated processing integrating computer-readable code into a computing system, wherein the code in combination with the computing system is enabled to perform the operations of the described embodiments.

The terms "an embodiment", "embodiment", "embodiments", "the embodiment", "the embodiments", "one or more embodiments", "some embodiments", and "one embodiment" mean "one or more (but not all) embodiments of the present invention(s)" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments of the present invention.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments of the present invention need not include the device itself.

At least certain operations that may have been illustrated in the figures show certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A method, comprising:
in response to detecting, by an Input/Output (I/O) enclosure, an inability to read a status of one or more fans within the I/O enclosure, initiating a power down warning and sending an interrupt to a rack power controller that is coupled to a storage controller, wherein the power down warning is an indication that the I/O enclosure will perform a shutdown after a predetermined amount of time;
in response to receiving the interrupt, detecting by the rack power controller that the I/O enclosure has initiated the power down warning, and sending a notification to the storage controller;
in response to receiving the notification, determining, via the storage controller, a presence of the indication from the I/O enclosure that the I/O enclosure will perform a shutdown after a predetermined amount of time, and determining whether the I/O enclosure provides a last path to data stored in a storage device;
in response to determining, by the storage controller, that the I/O enclosure provides the last path to data stored in the storage device, transmitting, by the storage controller, a message to the rack power controller to request the I/O enclosure to abort the shutdown of the I/O enclosure, wherein the rack power controller relays the message to the I/O enclosure to abort the shutdown of the I/O enclosure; and
in response to determining, by the storage controller, that the I/O enclosure does not provide the last path to data stored in the storage device, performing a quiescing and fencing of the I/O enclosure to take the I/O enclosure offline, and subsequently requesting a partner I/O enclosure to take over operations of the offlined I/O enclosure to avoid I/O interruption.

2. The method of claim 1, wherein the performing of the quiescing and fencing of the I/O enclosure to take the I/O enclosure offline, and subsequently requesting the partner I/O enclosure to take over operations of the offlined I/O enclosure to avoid I/O interruption comprises:
quiescing all I/O adapters of the I/O enclosure;
quiescing the I/O enclosure, in response to completion of quiescing of all of the I/O adapters of the I/O enclosure;
fencing the I/O enclosure and resources of all the I/O adapters, in response to completion of the quiescing of the I/O enclosure;
sending the I/O enclosure to an offline state by powering off the I/O enclosure, in response to quiescing the I/O enclosure; and
requesting the partner I/O enclosure to take over functions of the I/O enclosure in response to the I/O enclosure entering the offline state.

3. The method of claim 1, wherein the I/O enclosure is a first I/O enclosure, wherein the partner I/O enclosure is a second I/O enclosure that is configurable to substitute the first I/O enclosure, and wherein the second I/O enclosure may or may not be operational.

4. The method of claim 1, wherein if the I/O enclosure provides the last path to the data stored in the storage controller then in response to the shutdown of the I/O enclosure, a host is unable to access the data, and wherein if the I/O enclosure does not provide the last path to the data stored in the storage controller then in response to the shutdown of the I/O enclosure, the host is able to access the data via the partner I/O enclosure.

5. A system, comprising:
a memory; and
a processor coupled to the memory, wherein the processor performs operations, the operations comprising:
in response to detecting, by an Input/Output (I/O) enclosure, an inability to read a status of one or more fans within the I/O enclosure, initiating a power down warning and sending an interrupt to a rack power controller that is coupled to a storage controller, wherein the power down warning is an indication that the I/O enclosure will perform a shutdown after a predetermined amount of time;
in response to receiving the interrupt, detecting by the rack power controller that the I/O enclosure has initiated the power down warning, and sending a notification to the storage controller;
in response to receiving the notification, determining, via the storage controller, a presence of the indication from the I/O enclosure that the I/O enclosure will perform a shutdown after a predetermined amount of time, and determining whether the I/O enclosure provides a last path to data stored in a storage device;
in response to determining, by the storage controller, that the I/O enclosure provides the last path to data stored in the storage device, transmitting, by the storage controller, a message to the rack power controller to request the I/O enclosure to abort the shutdown of the I/O enclosure, wherein the rack power controller relays the message to the I/O enclosure to abort the shutdown of the I/O enclosure; and
in response to determining, by the storage controller, that the I/O enclosure does not provide the last path to data stored in the storage device, performing a quiescing and fencing of the I/O enclosure to take the I/O enclosure offline, and subsequently requesting a partner I/O enclosure to take over operations of the offlined I/O enclosure to avoid I/O interruption.

6. The system of claim 5, wherein the performing of the quiescing and fencing of the I/O enclosure to take the I/O enclosure offline, and subsequently requesting the partner I/O enclosure to take over operations of the offlined I/O enclosure to avoid I/O interruption comprises:
quiescing all I/O adapters of the I/O enclosure;
quiescing the I/O enclosure, in response to completion of quiescing of all of the I/O adapters of the I/O enclosure;
fencing the I/O enclosure and resources of all the I/O adapters, in response to completion of the quiescing of the I/O enclosure;
sending the I/O enclosure to an offline state by powering off the I/O enclosure, in response to quiescing the I/O enclosure; and
requesting the partner I/O enclosure to take over functions of the I/O enclosure in response to the I/O enclosure entering the offline state.

7. The system of claim 5, wherein the I/O enclosure is a first I/O enclosure, wherein the partner I/O enclosure is a second I/O enclosure that is configurable to substitute the first I/O enclosure, and wherein the second I/O enclosure may or may not be operational.

8. The system of claim 5, wherein if the I/O enclosure provides the last path to the data stored in a storage controller then in response to the shutdown of the I/O enclosure, a host is unable to access the data, and wherein if the I/O enclosure does not provide the last path to the data stored in the storage controller then in response to the shutdown of the I/O enclosure, the host is able to access the data via the partner I/O enclosure.

9. A computer program product, the computer program product comprising:
a computer readable storage medium having computer readable program code embodied therewith, the computer readable program code configured to perform operations, the operations comprising:
in response to detecting, by an Input/Output (I/O) enclosure, an inability to read a status of one or more fans within the I/O enclosure, initiating a power down warning and sending an interrupt to a rack power controller that is coupled to a storage controller, wherein the power down warning is an indication that the I/O enclosure will perform a shutdown after a predetermined amount of time;
in response to receiving the interrupt, detecting by the rack power controller that the I/O enclosure has initiated the power down warning, and sending a notification to the storage controller;
in response to receiving the notification, determining, via the storage controller, a presence of the indication from the I/O enclosure that the I/O enclosure will perform a shutdown after a predetermined amount of time, and determining whether the I/O enclosure provides a last path to data stored in a storage device;
in response to determining, by the storage controller, that the I/O enclosure provides the last path to data stored in the storage device, transmitting, by the storage controller, a message to the rack power controller to request the I/O enclosure to abort the shutdown of the I/O enclosure, wherein the rack power controller relays the message to the I/O enclosure to abort the shutdown of the I/O enclosure; and
in response to determining, by the storage controller, that the I/O enclosure does not provide the last path to data stored in the storage device, performing a quiescing and fencing of the I/O enclosure to take the I/O enclosure offline, and subsequently requesting a partner I/O enclosure to take over operations of the offlined I/O enclosure to avoid I/O interruption.

10. The computer program product of claim 9, wherein the performing of the quiescing and fencing of the I/O enclosure to take the I/O enclosure offline, and subsequently requesting the partner I/O enclosure to take over operations of the offlined I/O enclosure to avoid I/O interruption comprises:
in response to determining that the I/O enclosure does not provide the last path to data stored in the storage device, performing:
quiescing all I/O adapters of the I/O enclosure;
quiescing the I/O enclosure, in response to completion of quiescing of all of the I/O adapters of the I/O enclosure;
fencing the I/O enclosure and resources of all the I/O adapters, in response to completion of the quiescing of the I/O enclosure;
sending the I/O enclosure to an offline state by powering off the I/O enclosure, in response to quiescing the I/O enclosure; and
requesting the partner I/O enclosure to take over functions of the I/O enclosure in response to the I/O enclosure entering the offline state.

11. The computer program product of claim 9, wherein the I/O enclosure is a first I/O enclosure, wherein the partner I/O enclosure is a second I/O enclosure that is configurable to substitute the first I/O enclosure, and wherein the second I/O enclosure may or may not be operational, wherein if the first I/O enclosure provides the last path to the data stored in the storage controller then in response to the shutdown of the first I/O enclosure, a host is unable to access the data, and wherein if the first I/O enclosure does not provide the last path to the data stored in the storage controller then in response to the shutdown of the first I/O enclosure, the host is able to access the data via a second I/O enclosure.

12. The method of claim 1, wherein:
the one or more fans are not monitored by the storage controller but are monitored by the I/O enclosure; and
the rack power controller is configurable to communicate with the I/O enclosure that is offlined and the partner I/O enclosure, wherein the I/O enclosure that is offlined and the partner I/O enclosure are included in a rack.

13. The method of claim 12, wherein the I/O enclosure also initiates a power down warning and sends an interrupt to the rack power controller that is coupled the storage controller, in response to a detection made via tachometer readings of the one or more fans that the one or more fans are not operating properly.

14. The method of claim 13, wherein locking of bus lines that the I/O enclosure uses to receive data from the one or more fans causes the inability to read the status of the one or more fans within the I/O enclosure.

15. The system of claim 5, wherein:
the one or more fans are not monitored by the storage controller but are monitored by the I/O enclosure; and
the rack power controller is configurable to communicate with the I/O enclosure that is offlined and the partner I/O enclosure, wherein the I/O enclosure that is offlined and the partner I/O enclosure are included in a rack.

16. The system of claim 15, wherein the I/O enclosure also initiates a power down warning and sends an interrupt to the rack power controller that is coupled the storage controller, in response to a detection made via tachometer readings of the one or more fans that the one or more fans are not operating properly.

17. The system of claim 16, wherein locking of bus lines that the I/O enclosure uses to receive data from the one or more fans causes the inability to read the status of the one or more fans within the I/O enclosure.

18. The computer program product of claim 9, wherein:
the one or more fans are not monitored by the storage controller but are monitored by the I/O enclosure; and
the rack power controller is configurable to communicate with the I/O enclosure that is offlined and the partner I/O enclosure, wherein the I/O enclosure that is offlined and the partner I/O enclosure are included in a rack.

19. The computer program product of claim 18, wherein the I/O enclosure also initiates a power down warning and sends an interrupt to the rack power controller that is coupled the storage controller, in response to a detection made via tachometer readings of the one or more fans that the one or more fans are not operating properly.

20. The computer program product of claim 19, wherein locking of bus lines that the I/O enclosure uses to receive data from the one or more fans causes the inability to read the status of the one or more fans within the I/O enclosure.

* * * * *